United States Patent [19]
Ishibashi

[11] Patent Number: 5,931,577
[45] Date of Patent: Aug. 3, 1999

[54] DISPLAY DEVICE AND METHOD FOR MAKING THE SAME

[75] Inventor: Kazuo Ishibashi, Fukuoka, Japan

[73] Assignee: Atex Corporation Co., Ltd., Japan

[21] Appl. No.: 08/834,219

[22] Filed: Apr. 15, 1997

[30] Foreign Application Priority Data

Oct. 1, 1996 [JP] Japan .................................. 8-281518

[51] Int. Cl.$^6$ .................................................. F21V 21/00
[52] U.S. Cl. .......................... 362/800; 362/249; 362/252
[58] Field of Search .................................. 362/800, 249, 362/252

[56] References Cited

U.S. PATENT DOCUMENTS

| | | | |
|---|---|---|---|
| 3,714,414 | 1/1973 | Sternius | 240/10 R |
| 4,439,818 | 3/1984 | Scheib | 362/250 |
| 4,761,720 | 8/1988 | Solow | 362/252 |
| 4,953,066 | 8/1990 | Schiffer | 362/252 |
| 5,155,669 | 10/1992 | Yamuro | 362/252 |
| 5,193,895 | 3/1993 | Naruke et al. | 362/800 |
| 5,375,044 | 12/1994 | Guritz | 362/104 |
| 5,421,080 | 6/1995 | Bellavance et al. | 29/825 |
| 5,528,474 | 6/1996 | Roney et al. | 362/249 |
| 5,544,027 | 8/1996 | Orsano | 362/105 |
| 5,559,681 | 9/1996 | Duarte | 362/252 |
| 5,769,533 | 6/1998 | Yamuro et al. | 362/800 |

*Primary Examiner*—Ira S. Lazarus
*Assistant Examiner*—David Lee
*Attorney, Agent, or Firm*—Morrison Law Firm

[57] ABSTRACT

A series of light-emitting diodes (LEDs) flexibly interconnected to form an string is useful for forming displays with various patterns of LEDs. In the present invention, such a string of LEDs can be readily mass-produced by attaching the LEDs to a foldable flexible substrate. The substrate is then folded and inserted into a flexible transparent holder. The spaces between the holder and the substrate are filled with resin. In another embodiment, the substrate, with the LEDs attached, are held by fork-shaped tools in the space of a mold and the mold injected with molten resin. Before the resin cools completely, the tools are withdrawn and the resin permitted to fill in any voids left behind.

13 Claims, 7 Drawing Sheets

DISPLAY DEVICE AND METHOD FOR MAKING THE SAME

BACKGROUND OF THE INVENTION

The present invention relates to display devices with a plurality of light-emitting diodes arranged in a row. The present invention also relates to a method for making such display devices. The present applicant has proposed a technology for this type of display device in Japanese utility model number 3020888.

In the prior art technology, straight-line arrays of light-emitting diodes are connected by a flexible substrate. Thus, with this device, the shape of the display device may be altered freely, making it possible to create a variety of light-emitting diode patterns. Even when the shape of the display device is changed, the risk of breakage in the internal wiring connecting the light-emitting diodes is minimal due to the flexibility of the substrate.

However, the circuit pattern on this flexible substrate was never designed for surface mounting of the light-emitting diodes. Production of this display device requires each of the leads from the light-emitting diodes to be manually soldered to the electrodes on the flexible substrate. This makes it difficult to mass produce these devices.

OBJECT AND SUMMARY OF THE INVENTION

The object of the present invention is to provide a display device that not only can be shaped to form various light-emitting diode arrangements, but one that is well-suited to mass production.

A further object is to provide a method of making the same a display device that can be formed into various light-emitting diode arrangements.

Briefly, a series of light-emitting diodes (LEDs) is flexibly interconnected to form an string, useful for forming displays with various patterns of LEDs. The string of LEDs can be readily mass-produced by attaching the LEDs to a foldable flexible substrate. The substrate is then folded and inserted into a flexible transparent holder. The spaces between the holder and the substrate are filled with resin. In another embodiment, the substrate with the LEDs attached are held by fork-shaped tools in the space of a mold and the mold injected with molten resin. Before the resin cools completely, the tools are withdrawn and the resin permitted to fill in any voids left behind.

The display device of the present invention comprises a circuit module and a holding body surrounding the circuit module. The circuit module comprises a flexible substrate and a plurality of light-emitting diodes soldered to the flexible substrate separated at intervals. The holding body comprises a transparent or semi-transparent material that can be deformed length-wise. The holding body has a slit in which the flexible substrate is inserted and a space for holding the light-emitting diodes.

To make the display device of the present invention, a circuit pattern is formed on one surface of a flexible substrate so that the flexible substrate can bend along a center line parallel to its long axis. The circuit pattern includes pairs of electrodes separated by a first pitch. Solder cream is applied to each of the electrodes. Light-emitting diodes are mounted to the flexible substrate so that the leads of the light-emitting diodes contact the solder cream on the substrate. The light-emitting diodes are affixed in place by heating the flexible substrate and having the solder cream melt and then harden. Finally the flexible substrate is stored in a holding body.

According to one embodiment, there is provided, a circuit module and a holding body surrounding the circuit module. The circuit module has a flexible substrate with a longitudinal dimension, a plurality of light-emitting diodes soldered onto the flexible substrate and separated by a fixed pitch. The holding body is of a transparent or semi-transparent material that can be deformed lengthwise. The holding body has a slit in which the flexible substrate can be inserted and spaces into which the light-emitting diodes are received.

According to another embodiment of the present invention, there is provided, a display device, comprising: a circuit module, the circuit module having a longitudinal flexible substrate with conductive pattern formed thereon and a plurality of light-emitting diodes electrically connected to the conductive pattern, a longitudinal flexible holding body, the holding body having a slit with the longitudinal flexible substrate received therein, whereby the circuit module is supportable by the holding body.

According to still another embodiment of the present invention, there is provided, a display device, comprising: a longitudinal flexible strip with electrical contacts and a series of light-emitting diodes electrically connected to the electrical contacts, a flexible holder with a longitudinal recess into which the longitudinal flexible strip, with the light-emitting diodes, is inserted, the flexible holder being of translucent or transparent material, whereby light emitted by the light-emitted diodes passes through the flexible holder.

According to still another embodiment of the invention, a method for making a display device includes disposing a circuit pattern on one surface of a longitudinal flexible substrate that is bendable along a longitudinal axis thereof, the circuit pattern being formed so that pairs of electrodes separated by a first pitch can be positioned, applying cream solder on each of the electrodes, mounting the light-emitting diodes on the flexible substrate so that the leads of the light-emitting diodes come into contact with the solder cream applied to the substrate, attaching the light-emitting diodes to the flexible substrate by heating the flexible substrate so that the solder cream is melted and then hardened, and storing at least the flexible substrate into a holding body.

Thus, it is no longer necessary for the connections for the internal wiring connecting each of the light-emitting diodes to be performed manually. Instead this operation can be performed on a circuit module production line built around a electronic component mounting device or a reflow device. Thus, compared to the prior art, the present invention allows much quicker production on a larger scale.

According to still another embodiment of the present invention, there is provided, a method for making a display device, comprising the steps of: forming a circuit pattern onto one side of a flexible substrate, electrically connecting electrodes of a series of devices to the circuit pattern to attached the series of devices at a first pitch to the flexible substrate, folding the flexible substrate along a longitudinal axis thereof, whereby an overall width of the flexible substrate is reduced and inserting the flexible substrate in a holder.

Another method for making a display according to the invention includes forming a circuit module by soldering a plurality of light-emitting diodes on a flexible substrate, with a longitudinal axis, such that said light-emitting diodes are separated by intervals, using a tool to support the flexible substrate between an upper mold and a lower mold so that the circuit module is positioned between the upper mold and the lower mold, filling the space between the upper mold and the lower mold with a molten resin, moving the tool away from the upper mold and the lower mold before the resin is completely hardened, and releasing the upper mold and the lower mold after the resin has hardened.

According to still another embodiment of the present invention, there is provided, a method for making a display device, comprising the steps of: forming a circuit module by soldering a plurality of light-emitting diodes onto a longitudinal flexible substrate at a specified separation pitch, supporting the longitudinal flexible substrate within a space of a mold, the step of supporting including inserting the longitudinal flexible substrate in a tool, filling the space with a hardenable resin, retracting the tool away from the longitudinal flexible substrate before the resin hardens completely and releasing a molded structure from the mold when the resin is hardened.

With this configuration, the tool serves to prevent deformation of the flexible substrate. Since the tool is moved away from the upper mold and the lower mold before the resin completely hardens, the circuit module can be surrounded with a holding body that does not have any holes. Furthermore suitability for mass production of the device is further enhanced, by the fact that the holding body can be formed integrally with only a series of molding processes using the upper mold and the lower mold.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
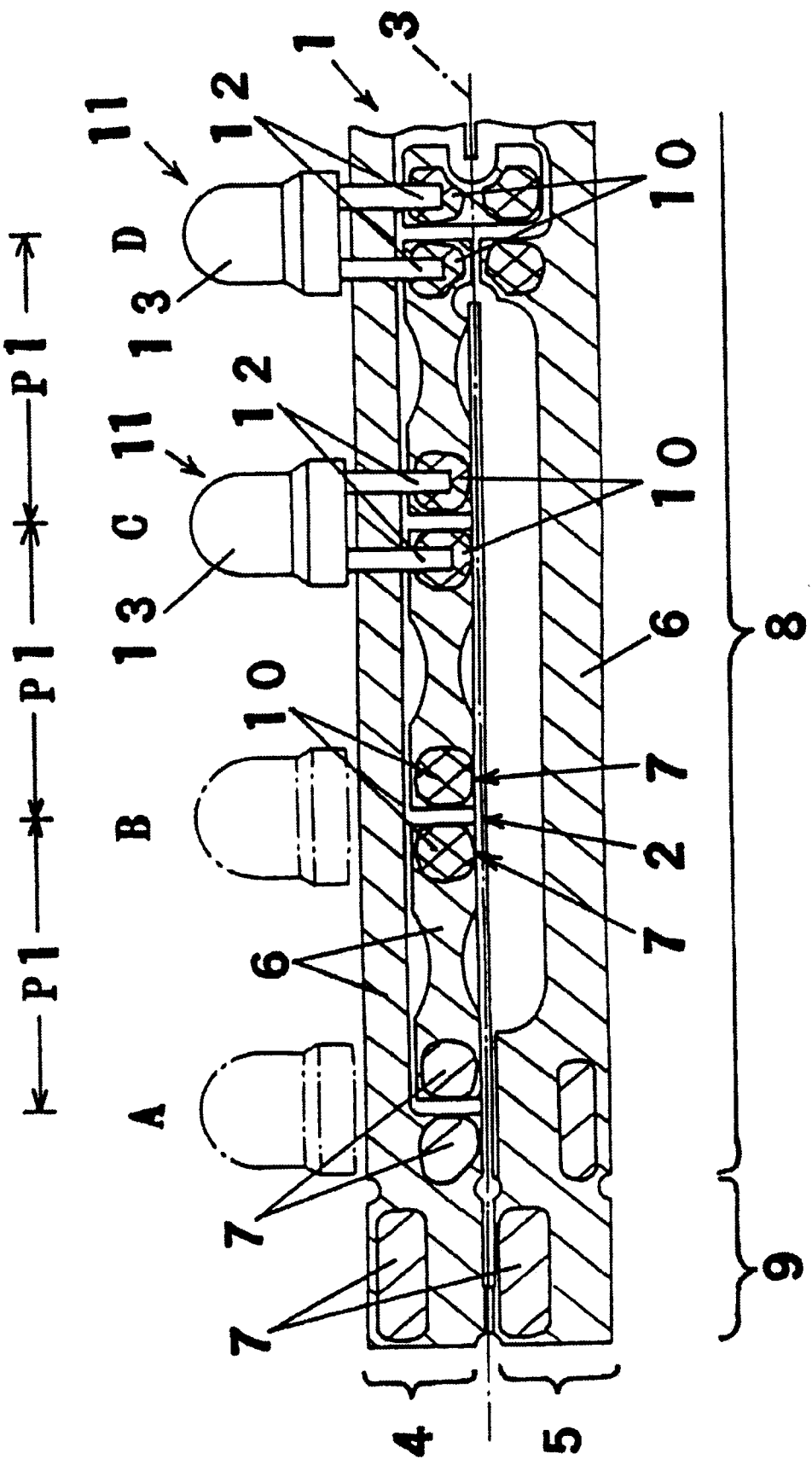
FIG. 1 is a drawing illustrating steps involved in the production of a circuit module according to an embodiment of the present invention.
Figure 2:
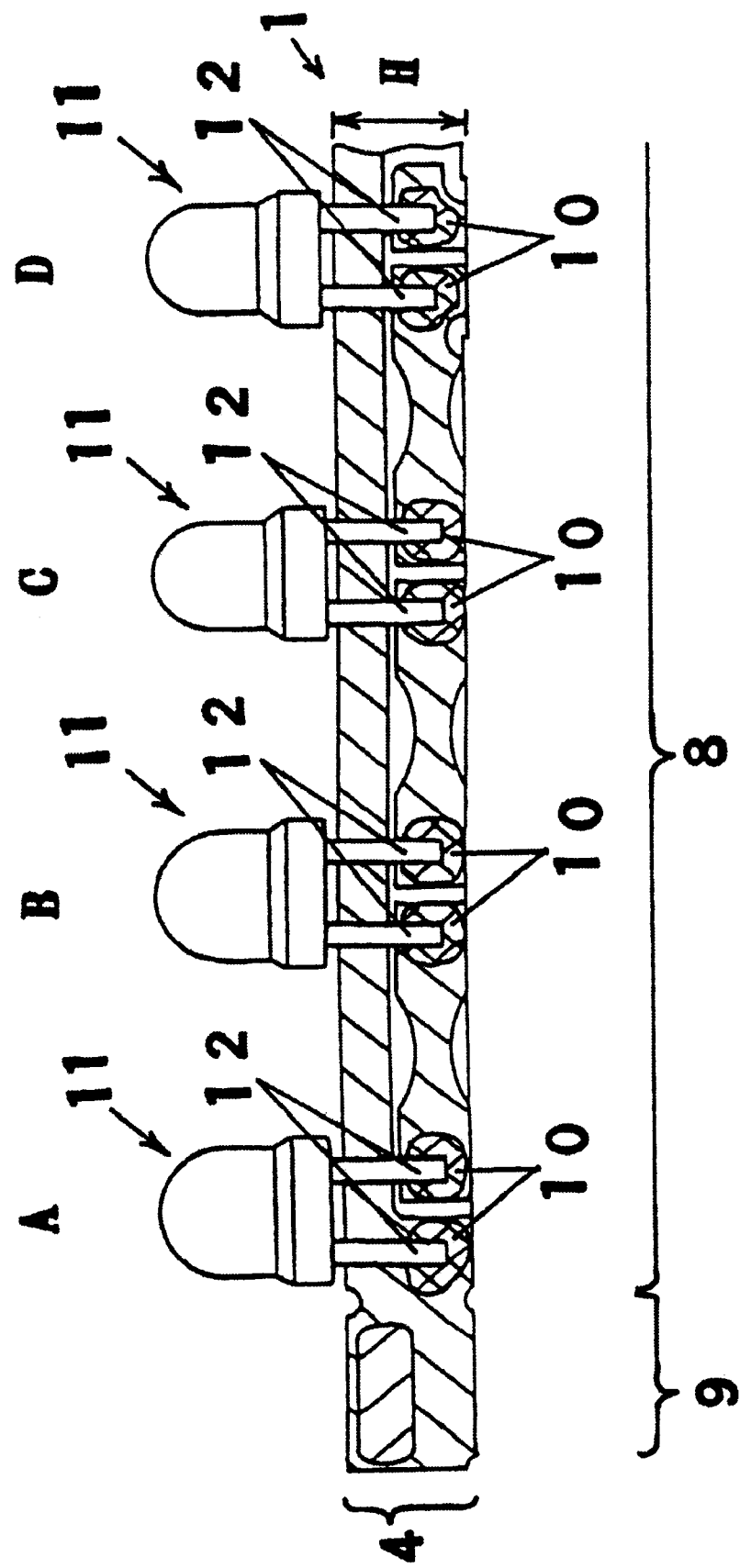
FIG. 2 is a drawing illustrating steps involved in the production of the circuit module according an embodiment of the present invention.

Referring to FIGS. 1 and 2, the processes involved in making one embodiment of a circuit module of a display device are described. A flexible substrate 1 has a longitudinal shape. Flexible substrate 1 may be primarily of polyimide. This material is just one example of a suitable material. A narrow slit 2 in flexible substrate 1 is formed along a center line 3 parallel to the longitudinal axis of flexible substrate 1. Flexible substrate 1 may be folded along center line 3 bringing an upper portion 4 and a lower portion 5 together. The circuit pattern on flexible substrate 1, used to drive light-emitting diodes 11, is of a copper foil about 35 microns thick.

A circuit pattern on one side of flexible substrate 1 and most of the upper surface of the circuit pattern are covered by a film and insulated. However, at upper half 4, there is no film at the points at which leads 12 of light-emitting diodes 11 are connected (electrodes 7). Electrodes 7 are exposed to the outside and pairs of electrodes 7 are disposed along the length-wise axis of flexible substrate 1 separated by a first pitch P1.

Light-emitting diodes 11 are mounted on flexible substrate 1 in the following manner. Referring to section A of FIG. 1, flexible substrate 1 is positioned so that the side on which the circuit pattern is formed is facing up. With upper half 4 and lower half 5 in an unbent state, flexible substrate 1 is set horizontally using a tool or the like not shown in the drawing. Flexible substrate 1 is then sent to a circuit module production line.

Referring to section B, in the circuit module production line, flexible substrate 1 is then set under a mask from a screen printing device. The mask has pattern holes matching the positions of electrodes 7. Then, a squeegee is slid over the mask, and a solder cream 10 is applied to electrodes 7 via the pattern holes.

Next, flexible substrate 1 is transferred from the screen printing device to a device for mounting electronic parts. Referring to section C, light-emitting diodes 11 are then mounted on upper half 4 of flexible substrate 1 so that leads 12 of light-emitting diode 11 come into contact with solder cream 10.

Then, flexible substrate 1 is transferred to a reflow device. The reflow device is set up with a temperature profile in which flexible substrate 1 is heated temporarily from room temperature to a temperature (e.g. 220–230 degrees C.) at or above the melting temperature of solder (generally 183 degrees C.). Then, the temperature is dropped back down to room temperature.

Thus, by passing flexible substrate 1 through the reflow device, solder cream 10, applied to electrodes 7 of flexible substrate 1, melts and then hardens. Referring to section D, leads 12 temporarily fixed to electrodes 7 are fixed and electrically connected to electrode 7 through the adhesive strength of solder cream 10.

Referring to FIG. 2, flexible substrate 1, to which light-emitting diodes 11, are affixed is bent along center line 3. Thus the width of the resulting shape of flexible substrate 1 is reduced to width H of half 4 or 5 (half of the overall width of flexible substrate 1). This provides a more compact structure.

By bending flexible substrate 1 in this manner, the sides of upper half 4 and lower half 5 without circuit patterns (the side not shown in FIG. 1), face each other. These are adhered together using an adhesive tape or the like. By adhering two layers of flexible substrate 1 together in this manner, flexible substrate 1 is reinforced and the risk of circuit breakage is reduced.

A completed circuit module is created through the above process. The circuit module according to the embodiment described above is amenable to mass production on a circuit module production line. This allows simple and quick mass production.

Referring to FIGS. 3 through 6, the following is a description of a holding body whose purpose is to support and strengthen the circuit module described above.

Figure 3:
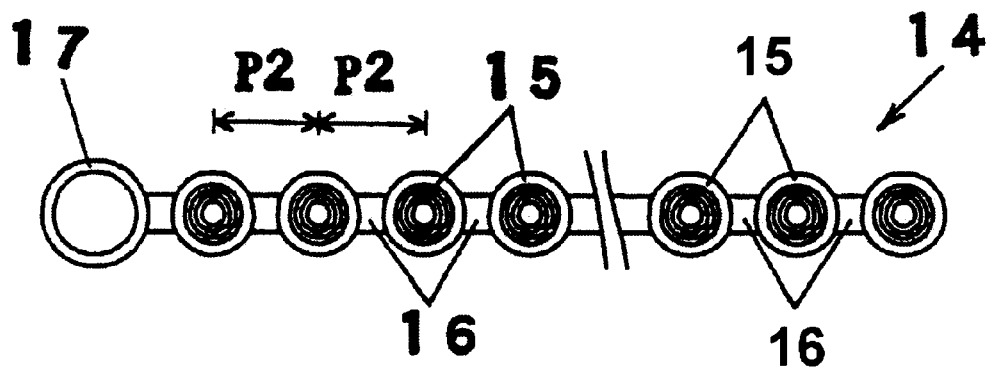
FIG. 3 is a plan view of a holding body according an embodiment of the present invention.
Figure 4:
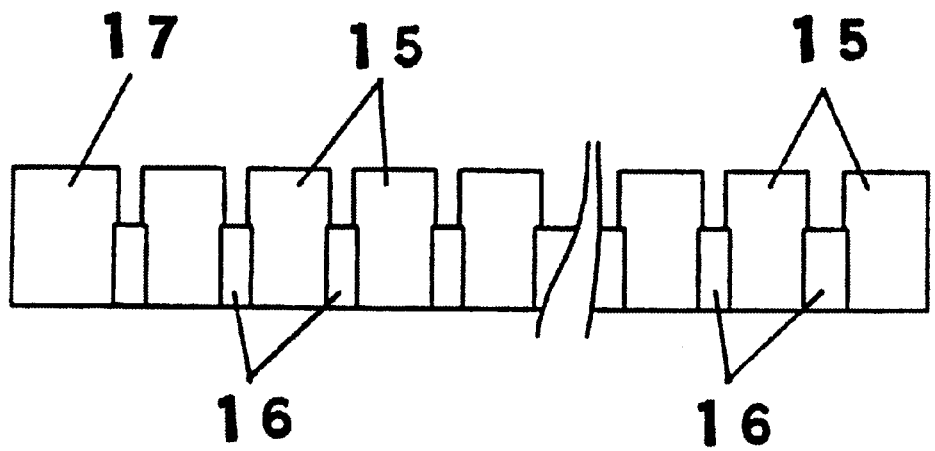
FIG. 4 is a front-view drawing of a holding body according to an embodiment of the present invention.

Referring to FIGS. 3 and 4, a holding body 14 has holders 15 aligned in a row and separated by a second pitch P2, somewhat smaller than first pitch P1. Adjacent holders 15 are interconnected through connecting sections 16. A connecting section 17 is provided connect additional holding bodies to form an even longer display device or to connect to a driver circuit for the display device.

Figure 5:
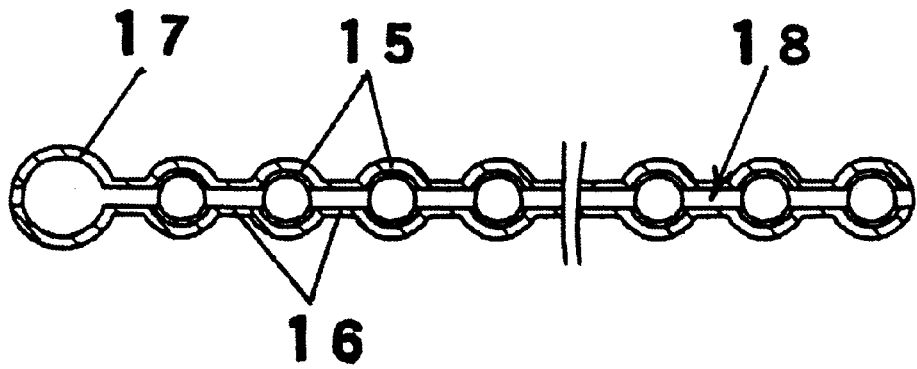
FIG. 5 is a bottom-view drawing of a holding body according to an embodiment of the present invention.
Figure 6:
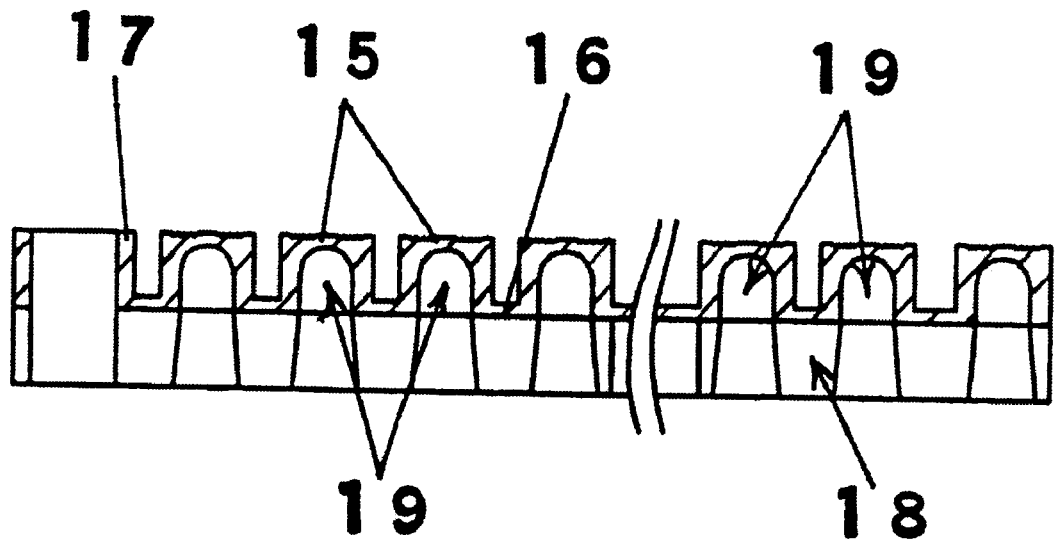
FIG. 6 is a cross-section drawing of a holding body according to an embodiment of the present invention.

Referring to FIG. 5, a slit 18 is formed on the bottom side of holding body 14, along a longitudinal axis of holding body 14. Slit 18 has a rectangular cross section. Referring to FIG. 6, the upper half of each of holders 15 has an internal space 19 to hold a lens 13 of one of the light-emitting diodes 11.

Holding body 14 may be made of, for example, a transparent or semi-transparent silicone, that can be freely bent along the length-wise axis.

Figure 7:
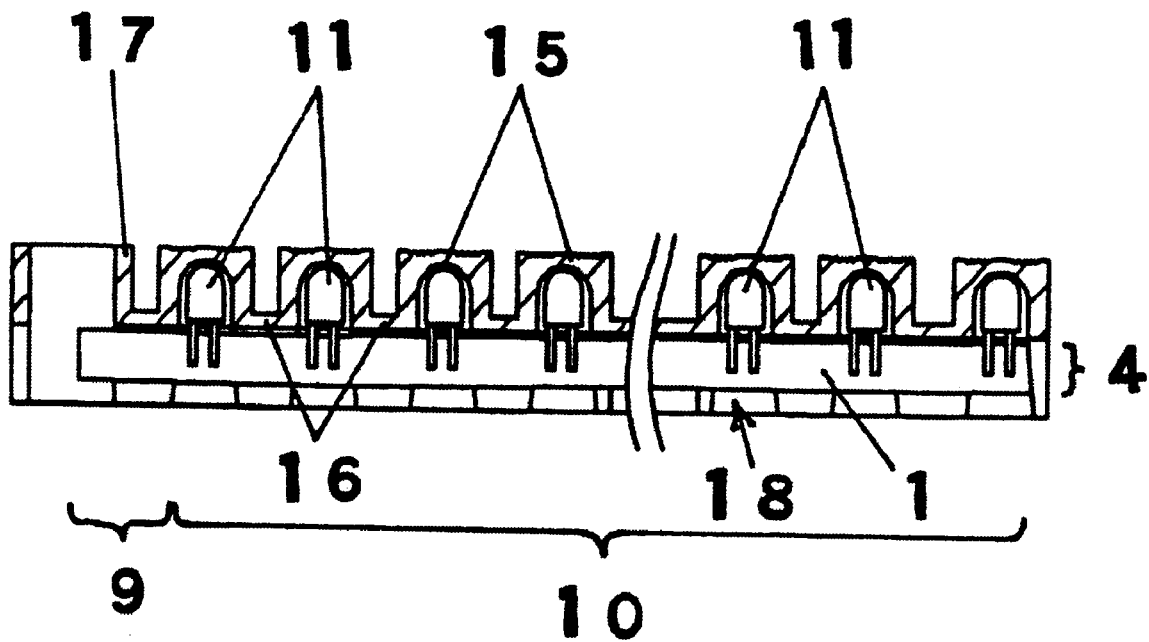
FIG. 7 is a cross-section drawing of a display device according to an embodiment of the present invention.
Figure 8:
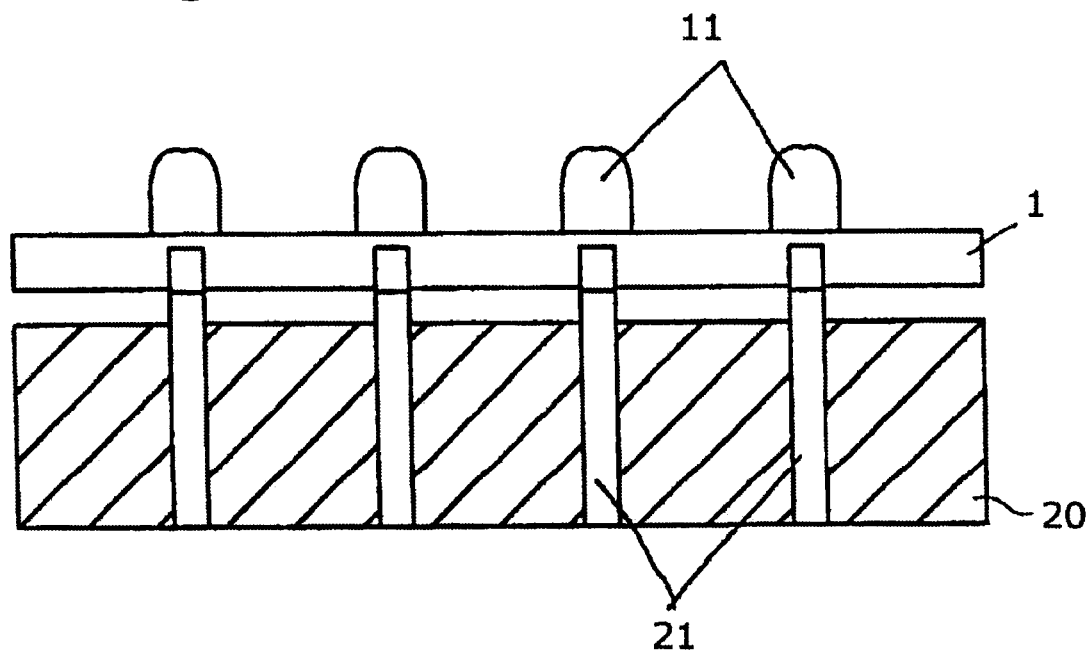
FIG. 8 is a drawing illustrating the steps involved in the production of the holding body according to another embodiment of the present invention.

In the next step in making an embodiment of the invention, the circuit module described above is inserted into holding body 14. Referring to FIG. 7, flexible substrate 1, which has been bent, so that it has width H, is inserted into slit 18. A lens 13 of each light-emitting diode 11 inserts into space 19 of holder 15. A connecting section 9 of flexible substrate 1 extends into connection section 17. Connecting section 9 has contacts 7 that can allow interconnection of the completed display device with other display devices and/or driver circuits.

Since second pitch P2 is smaller than first pitch P1, the sections of flexible substrate 1 within connecting sections 16 (the sections that connect adjacent light-emitting diodes 11) are stored within connecting section 16 with ample leeway. Thus, if the display device is bent, excessive tension is flexible substrate 1 is avoided, thereby preventing breakage in circuit pattern 7.

Next, a transparent resin may be fed through slit 18, and allowed to harden. Slit 18 is thereby sealed and a completed display device formed.

Figure 9:
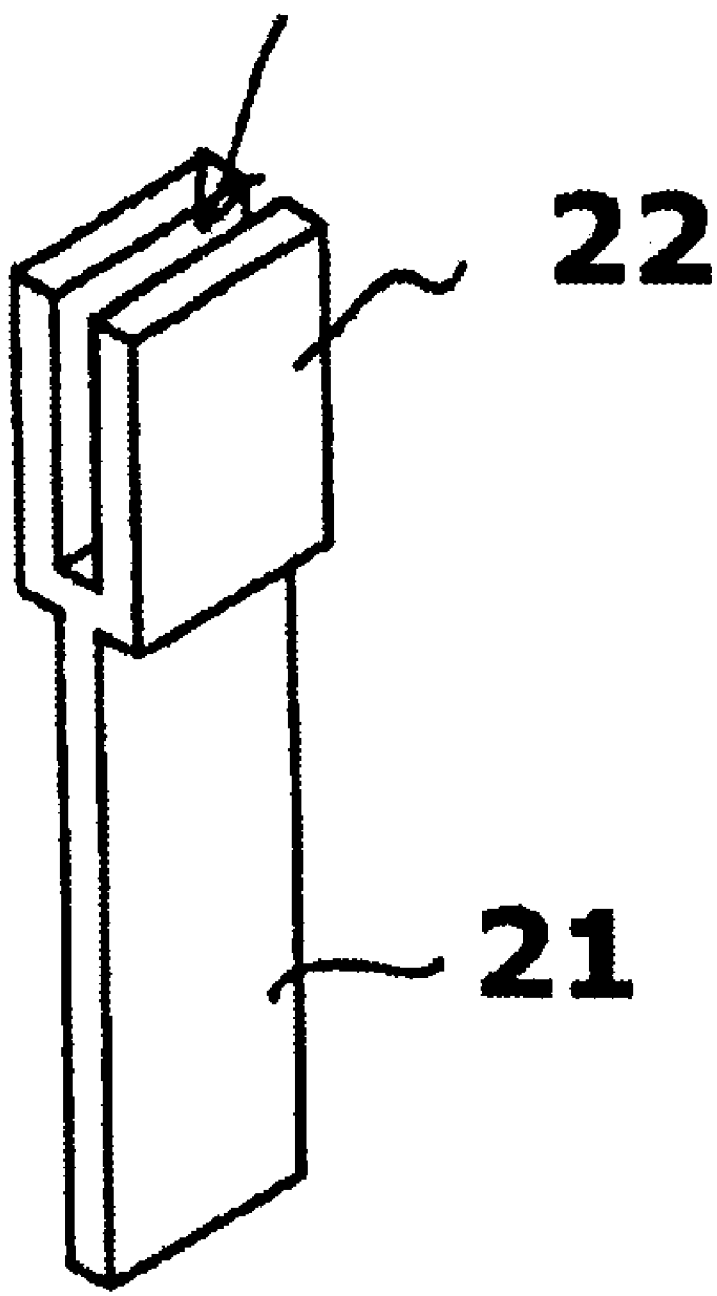
FIG. 9 is a perspective drawing of a tool used in another embodiment of the present invention.

Referring to FIGS. 8 through 12, another embodiment of the present invention employs a metal mold to form the holding body integrally. Flexible substrate 1 of the circuit module (FIGS. 1 and 2) is set on a lower mold 20. In lower mold 20, a plurality of tools 21, separated by the same pitch that of the light-emitting diodes 11, are set in place. Tools 21 can freely move up and down. As best seen in FIG. 9, tool 21 has a forked support 22 with two sections at the upper portion. Flexible substrate 1 is inserted in a gap 23 in support 22 to support the circuit module from below.

Figure 10:
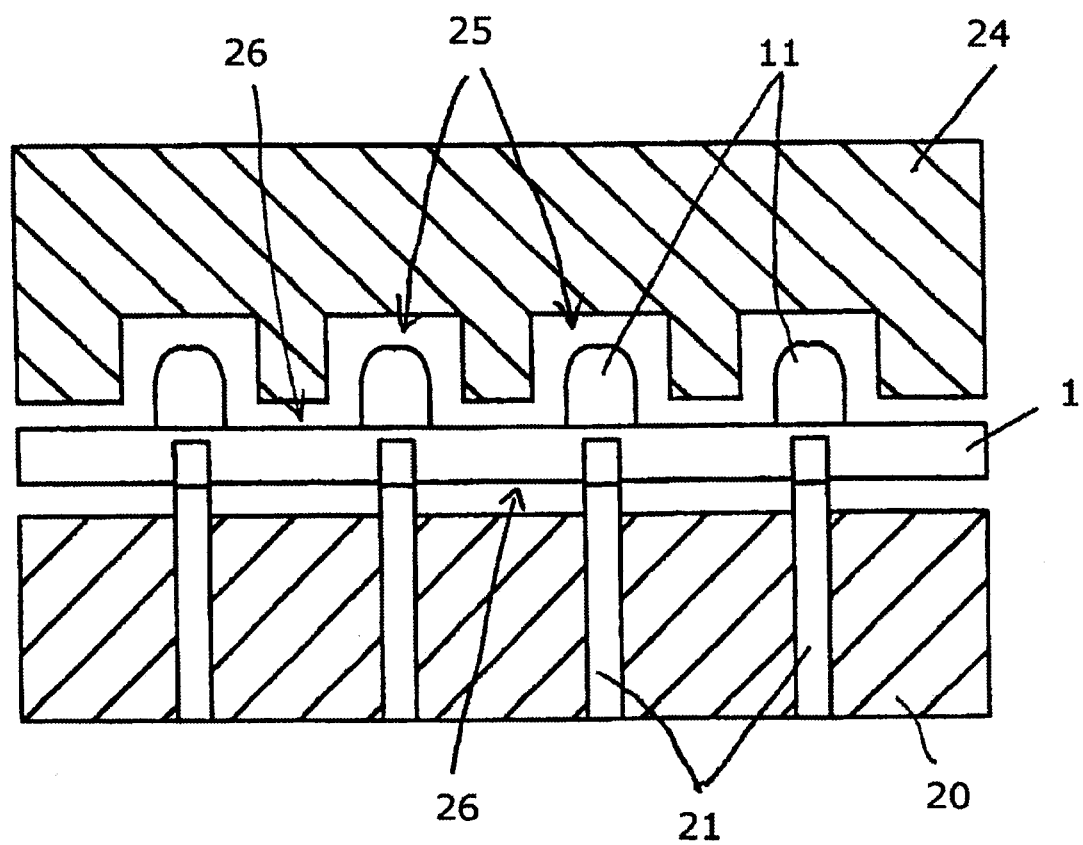
FIG. 10 is a drawing illustrating the steps involved in the production of the holding body according to another embodiment of the present invention.

Referring to FIG. 10, upper mold 24 is then positioned to face lower mold 20. Upper mold 24 has alternating cavities 25 defined by intervening projections. Light-emitting diodes 11 are positioned in first cavities 25 on upper mold 24, which is used to form a final holder 15. Also, band-shaped second cavities 26 are formed above and below flexible substrate 1 later to form connecting sections 16.

Figure 11:
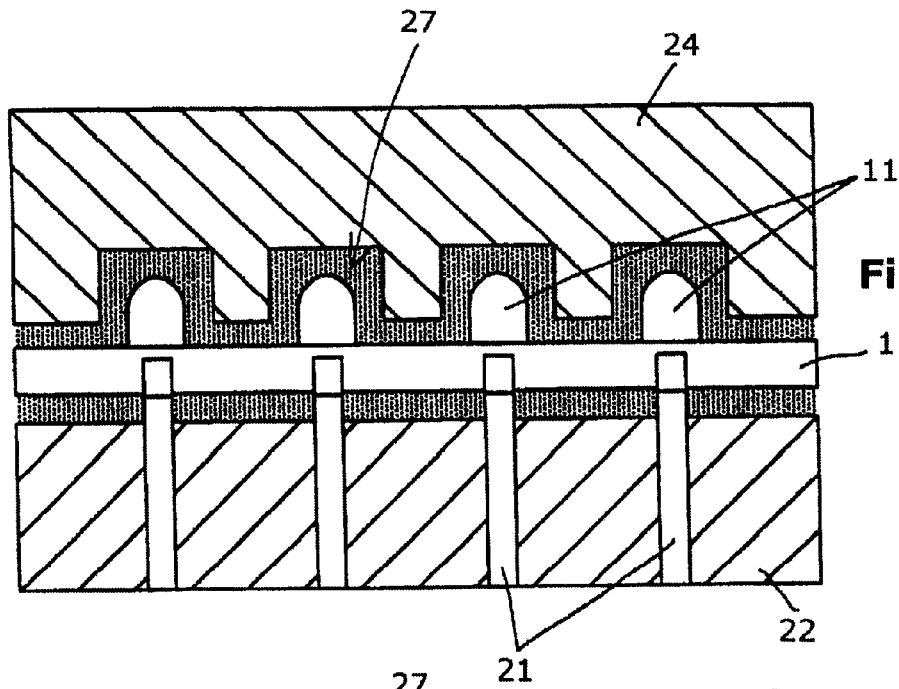
FIG. 11 is a drawing illustrating the steps involved in the production of the holding body according to another embodiment of the present invention.

Referring to FIG. 11, upper mold 24 and lower mold 20 are held at a high temperature, and a molten, transparent resin 27 injected in first cavities 25 and second cavities 26 until both cavities are filled.

Figure 12:
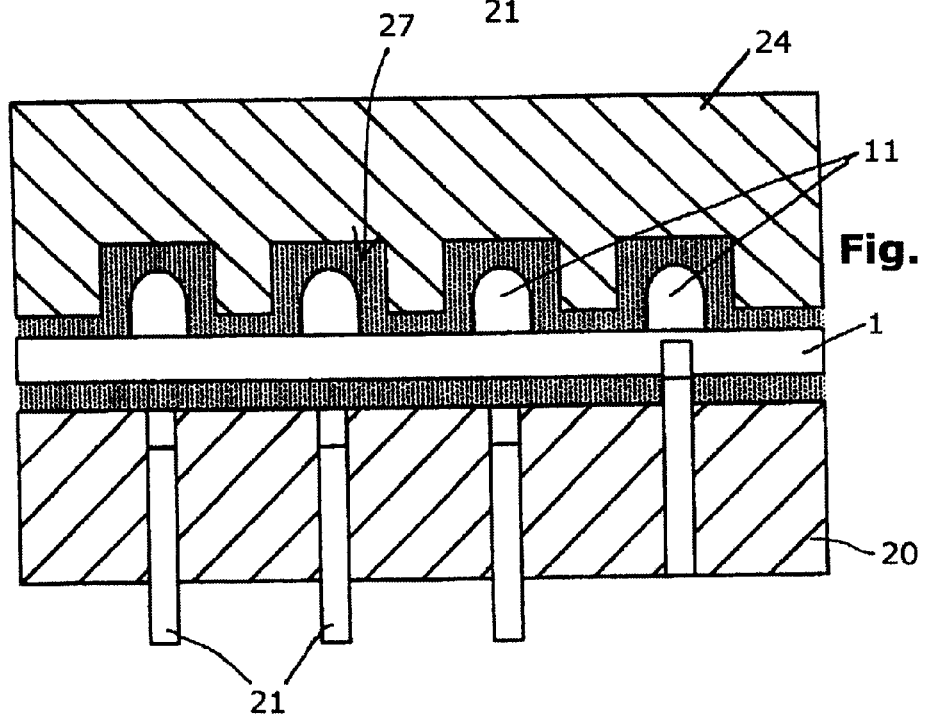
FIG. 12 is a drawing illustrating the steps involved in the production of the holding body according to another embodiment of the present invention.

Next, resin 27 is hardened. Referring to FIG. 12, before resin 27 has completely hardened, tools 21 are lowered out and away from second cavity 26. At this point, unhardened resin 27 flows into the portions formerly occupied by tools 21 so that resin 27 completely seals the circuit module.

Figure 13:
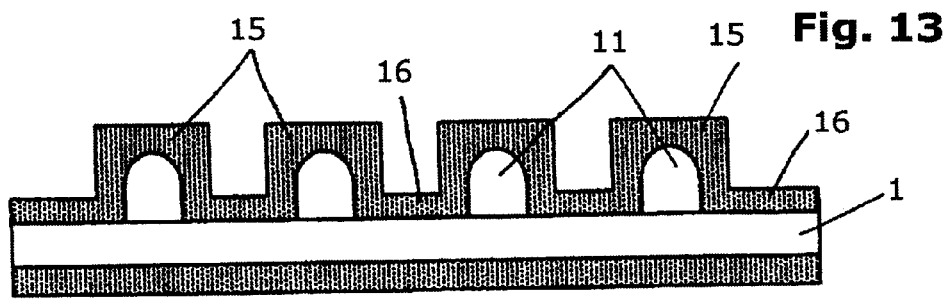
FIG. 13 is a drawing illustrating the holding body resultant from the steps shown in FIG. 12.

Once resin 27 has completely hardened, upper mold 24 and lower mold 20 are released. Referring to FIG. 13, the above procedure results in a display device having holder portions 15 and connecting portions 16.

In the above embodiment, tools 21 support flexible substrate 1, which is easily deformed, in the proper position until flexible substrate 1 is surrounded by resin 27. This allows the circuit module to be held in a prescribed configuration within the holding body. Furthermore, holders 15 and connecting portions 16 are entirely formed by the above-described series of molding processes using metal molds. This results in further improvements in the mass production of the device.

Also, the processes described above can be repeatedly performed while moving flexible substrate 1 along its longitudinal axis. This makes it possible to form a long display device.

The present invention, configured as described above, makes it possible to form patterns with light-emitting diode strings that can be formed freely into various shapes while preventing circuit breaks. Furthermore, a circuit module production line can be used to produce this device, ameliorating mass production.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A display device comprising:

a circuit module;

said circuit module having a longitudinal flexible substrate with a conductive pattern formed thereon and a plurality of light-emitting diodes electrically connected to said conductive pattern;

a longitudinal flexible holding body;

said holding body having a slit with said longitudinal flexible substrate received therein, whereby said circuit module is supportable by said holding body; and said holding body has a series of recesses, each having received therein a respective one of said plurality of light-emitting diodes.

2. A device as in claim 1, wherein:

said holding body has a series of recesses, each having received therein a respective one of said plurality of light-emitting diodes, and said holding body is at least partly of material that is translucent.

3. A device as in claim 1, wherein:

said holding body has a series of recesses, each having received therein a respective one of said plurality of light-emitting diodes; and spaces between said holding body and said circuit module are filled with resin. with resin.

4. A display device comprising:

a circuit module;

said circuit module having a longitudinal flexible substrate with a conductive pattern formed thereon and a plurality of light-emitting diodes electrically connected to said conductive pattern;

a longitudinal flexible holding body; and said holding body having a slit with said longitudinal flexible substrate received therein, whereby said circuit module is supportable by said holding body;

said holding body has a series of recesses, each having received therein a respective one of said plurality of light-emitting diodes; and spacing between adjacent light-emitting diodes is greater than a corresponding spacing between adjacent ones of said series of recesses.

5. A display device, comprising:

a longitudinal flexible strip with electrical contacts and a series of light-emitting diodes electrically connected to said electrical contacts;

a flexible holder with a longitudinal recess into which said longitudinal flexible strip, with said light-emitting diodes, is inserted;

said flexible holder being of translucent or transparent material, whereby light emitted by said light-emitted diodes passes through said flexible holder;

said flexible strip has an electrical circuit printed thereon; and said holder has a terminal recess at an end thereof into which a portion of said longitudinal flexible strip, with a terminal electrical contact, protrudes, whereby said electrical circuit may be connected with an external device.

6. A method for making a display device, comprising the steps of:

forming a circuit pattern onto one side of a flexible substrate;

electrically connecting electrodes of a series of devices to said circuit pattern to attached said series of devices at a first pitch to said flexible substrate;

folding said flexible substrate along a longitudinal axis thereof, whereby an overall width of said flexible substrate is reduced; and inserting said flexible substrate in a holder.

7. A method as in claim 6, further comprising the step of filling gaps between said flexible substrate and said holder with a material that hardens to a flexible state.

8. A method as in claim 6, further comprising the step of filling gaps between said flexible substrate and said holder with a material that hardens to a flexible state;

said step of electrically connecting including applying solder cream to said circuit pattern and heating said flexible substrate.

9. A method as in claim 6, wherein said step of inserting includes aligning said series of devices with respective openings in a holder.

10. A method as in 6, wherein:

said step of inserting includes the step of aligning said series of devices with respective openings in a holder;

said step of aligning includes supporting said series of devices such that said flexible substrate has zero tension therein.

11. A method as in claim 6, wherein said step of folding includes folding said flexible substrate in a direction such that said circuit pattern remains uncovered and adhering together portions of said flexible substrate that face each other as a result of said folding.

12. A method for making a display device, comprising the steps of:

forming a circuit module by electrically connecting a plurality of light-emitting diodes onto a longitudinal flexible substrate at a specified separation pitch;

supporting said longitudinal flexible substrate within a space of a mold;

said step of supporting including inserting said longitudinal flexible substrate in a tool;

filling said space with a hardenable resin;

retracting said tool away from said longitudinal flexible substrate before said resin hardens completely; and releasing a molded structure from said mold when said resin is hardened.

13. A method as in claim 12, wherein said step of inserting includes inserting said longitudinal flexible substrate in a fork-shaped tool.

\* \* \* \* \*